(12) United States Patent
Huang et al.

(10) Patent No.: US 7,575,957 B2
(45) Date of Patent: *Aug. 18, 2009

(54) LEADLESS SEMICONDUCTOR PACKAGE AND METHOD FOR MANUFACTURING THE SAME

(75) Inventors: Yao-Ting Huang, Kaohsiung (TW); Chih-Te Lin, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 279 days.

This patent is subject to a terminal disclaimer.

(21) Appl. No.: 11/143,676

(22) Filed: Jun. 3, 2005

(65) Prior Publication Data

US 2005/0287710 A1    Dec. 29, 2005

(30) Foreign Application Priority Data

Jun. 29, 2004    (TW) ............................... 93119076 A

(51) Int. Cl.
   *H01L 21/00*    (2006.01)
(52) U.S. Cl. ............... 438/123; 257/676; 257/E23.006; 257/E23.049; 257/E23.052; 257/E23.055
(58) Field of Classification Search ................. 438/617, 438/127, 111, 123; 257/790, 676, E23.052, 257/E23.006, E23.049, E23.055
   See application file for complete search history.

(56) References Cited

U.S. PATENT DOCUMENTS

| | | | | |
|---|---|---|---|---|
| 6,452,255 | B1 * | 9/2002 | Bayan et al. | 257/666 |
| 6,483,180 | B1 * | 11/2002 | Bayan et al. | 257/684 |
| 6,577,013 | B1 * | 6/2003 | Glenn et al. | 257/777 |
| 6,629,880 | B1 * | 10/2003 | Kang et al. | 451/59 |
| 6,975,022 | B2 * | 12/2005 | Sakamoto et al. | 257/676 |
| 7,312,105 | B2 * | 12/2007 | Huang et al. | 438/108 |

OTHER PUBLICATIONS

The American Heritage College Dictionary, Houghton Mifflin Company, Fourth Edition, p. 714.*
Van Zant, "Microchip Fabrication—A Practical Guide To Semiconductor Processing"; 2004; McGraw-Hill Companies; p. 590.*

* cited by examiner

*Primary Examiner*—Matthew C Landau
*Assistant Examiner*—Vicki B Booker
(74) *Attorney, Agent, or Firm*—Bacon & Thomas, PLLC

(57) ABSTRACT

A leadless semiconductor package mainly includes a plurality of inner leads, a chip pad, a semiconductor chip and a molding compound. A non-conductive ink is filled between every two of the inner leads, and couples the inner leads to the chip pad so as to be in replacement of the conventional tie bars. The semiconductor chip is disposed on the chip pad and electrically connected to the inner leads. Moreover, the molding compound is formed on the inner leads and the non-conductive ink for encapsulating the semiconductor chip. The non-conductive ink prevents the exposed bottom surfaces of the inner leads from contamination by the molding compound without attaching an external tape during molding. Also the inner leads can be in a multi-row arrangement and the chip pad can be disposed in an optional location.

16 Claims, 8 Drawing Sheets

LEADLESS SEMICONDUCTOR PACKAGE AND METHOD FOR MANUFACTURING THE SAME

This application claims the benefit of Taiwan application Serial No. 93119076, filed Jun. 29, 2004, the subject matter of which is incorporated herein by reference.

BACKGROUND OF THE INVENTION

1. Field of the Invention

The invention relates in general to semiconductor packaging technology using a leadless leadframe, and more particularly to a leadless semiconductor package and the manufacturing method for the same.

2. Description of the Related Art

Conventional semiconductor package uses a chip carrier to carry and electrically connects a semiconductor chip, such as a circuit substrate and a leadframe. Using the leadless leadframe as the chip carrier has the advantages of low cost and small scale. After packaging, the arrangement and number of the leadframe inner leads are subject to the restriction of the manufacturing process and design of the leadless leadframe, thus having limited application.

Referring to FIGS. 1 and 2, a conventional leadless semiconductor package 1 includes a chip pad 11, a plurality of inner leads 12, a semiconductor chip 20 and a molding compound 30. The chip pad 11 and the inner leads 12 are components of a leadless leadframe. As shown in FIG. 2, the inner leads 12 are formed on the outer periphery of the chip pad 11. The chip pad 11 is coupled to the leadframe via a plurality of tie bars 13. As shown in FIG. 1, a rear surface 22 of the semiconductor chip 20 is disposed on the chip pad 11 via an adhesive 24. One active surface 21 of the chip 20 has a plurality of bonding pads 23. The bonding pads 23 of the chip 20 are coupled to the inner leads 12 via a plurality of bonding wires 25. The molding compound 30 is used to encapsulate the chip 20 and the bonding wires 25. Conventional molding compound 30 is made through molding. To prevent the inner leads 12 and the bottom surface of the chip pad 11 from being contaminated by the residual of the molding compound 30 due to the compression and diffusion of the compound, a conventional practice is to attach an external tape 40 to completely cover up the inner leads 12 and the bottom surface of the chip pad 11 (shown in FIG. 1). Accordingly, the molding compound 30 does not contaminate the inner leads 12 and the bottom surface of the chip pad 11, and the external tape 40 is removed after the molding compound 30 is formed. So, the external tape 40 is a consumable material during manufacturing process that can not exist inside the leadless semiconductor package 1. However, extra steps are required in the manufacturing process to attach and remove the external tape 40. Moreover, the chip pad 11 has to be connected via a plurality of tie bars 13. Normally, the tie bars 13 should correspond to the four corners of the molding compound 30, and the inner leads 12 should have considerable width to provide enough structural strength to be connected to the frame bars of the leadframe. Therefore, the arrangement of the chip pad 11 and the inner leads 12 are subject to the manufacturing process of the leadframe and can not be in an optional location.

SUMMARY OF THE INVENTION

A main object of the invention is to provide a leadless semiconductor package including a chip pad and a plurality of inner leads. The chip pad and inner leads are components of a leadframe. A non-conductive ink is formed between every two of the inner leads, and between the chip pad and the inner leads. The non-conductive ink couples the inner leads to the chip pad to be in replacement of the conventional tie bar, so that the disposition of the inner leads is made easier. During the molding of the molding compound, it is not essential to attach a conventional external tape onto the bottom surface of the leadframe to prevent the bottom surfaces of the inner leads and the chip pad from contamination by the residual of the molding compound.

A second object of the invention is to provide a leadless semiconductor package. A non-conductive ink is formed between every two of the inner leads, and couples the inner leads to the chip pad without using conventional tie bars positioned at the corners of molding compound to connect the chip pads. Therefore, the inner leads can be formed at the corners of the molding compound or in multi-row arrangement on the periphery, increasing the scope of application of the leadless leadframe in high-density I/O semiconductor package.

The leadless semiconductor package according to the invention includes a plurality of inner leads, at least a chip pad, a non-conductive ink, a semiconductor chip and a molding compound. The chip pad and inner leads are components of a leadframe. The non-conductive ink is formed between every two of the inner leads and couples the inner leads to the chip pad. The semiconductor chip is disposed on the chip pad and electrically connected to the inner leads. The molding compound is formed on the inner leads and the non-conductive ink for encapsulating the semiconductor chip. Preferably, part of the inner leads can be formed at the corners of the molding compound or in multi-row arrangements on the periphery. Besides, the inner leads can be arranged in a higher density, so the leadless semiconductor package can be a multi-chip package or further include a passive component Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
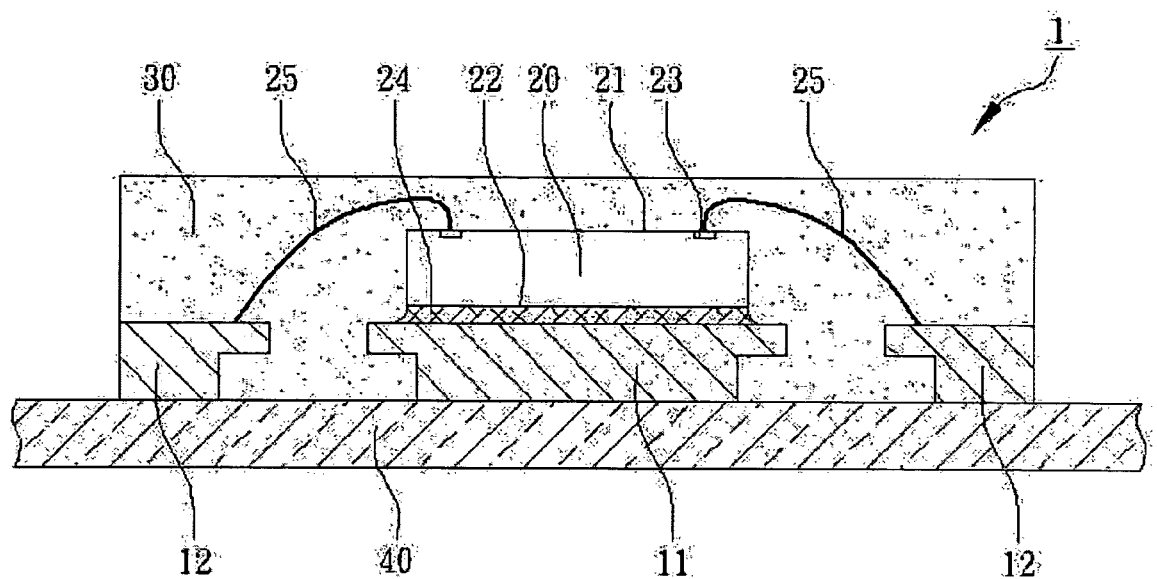
FIG. 1 (Prior Art) is a cross-sectional view of a conventional leadless semiconductor package.
Figure 2:
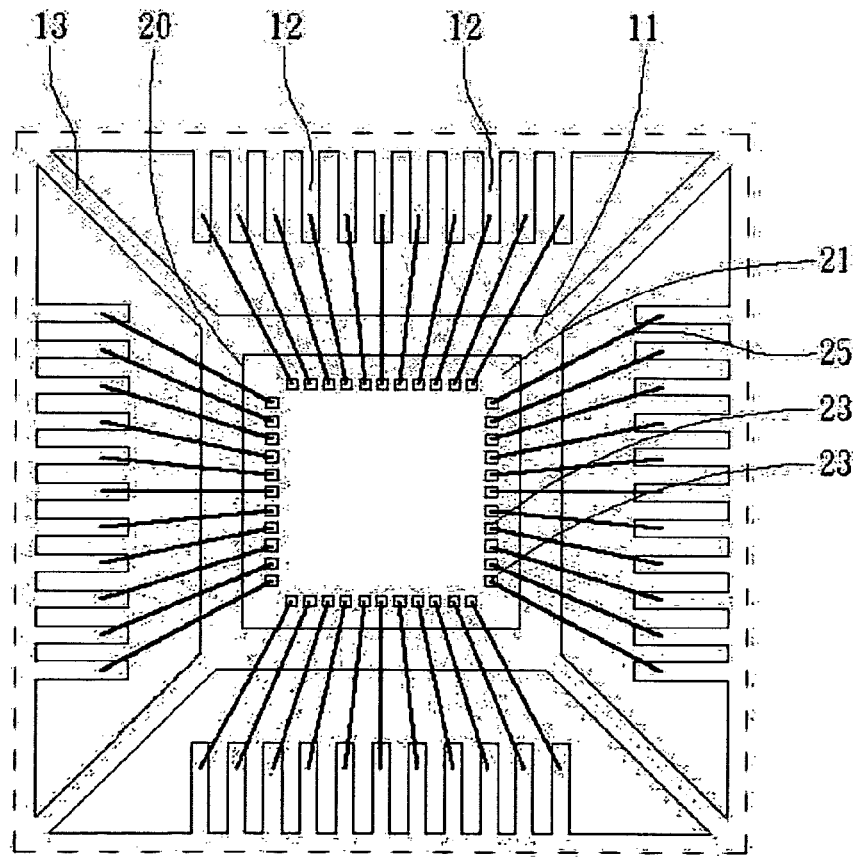
FIG. 2 (Prior Art) is a top view of the conventional leadless semiconductor package before encapsulation.
Figure 3:
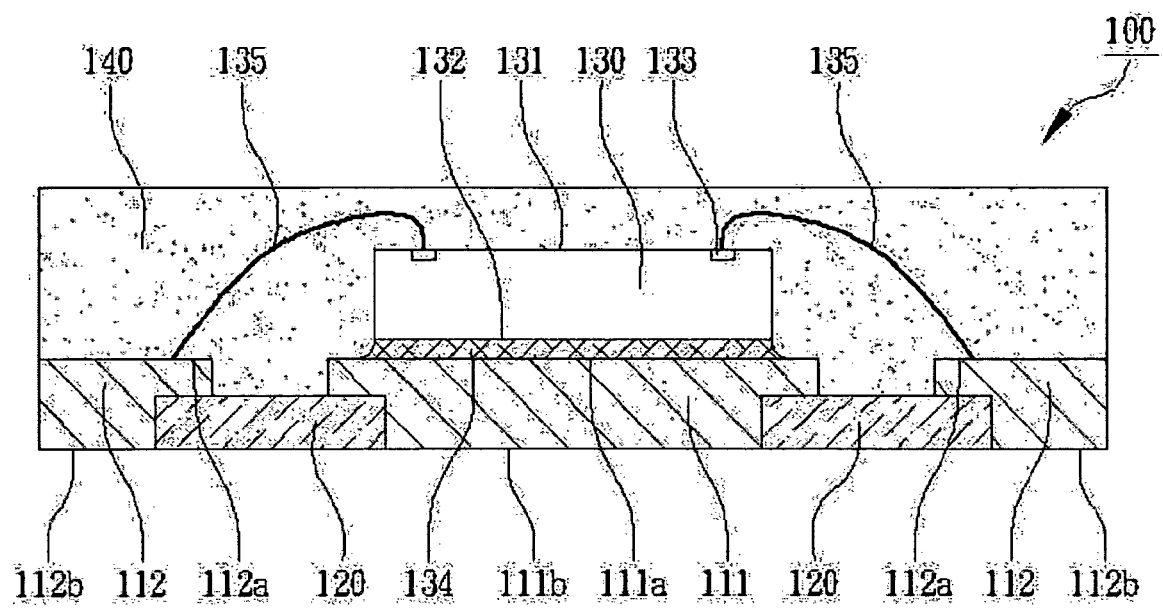
FIG. 3 is a cross-sectional view of a leadless semiconductor package according to a first embodiment of the invention.
Figure 4:
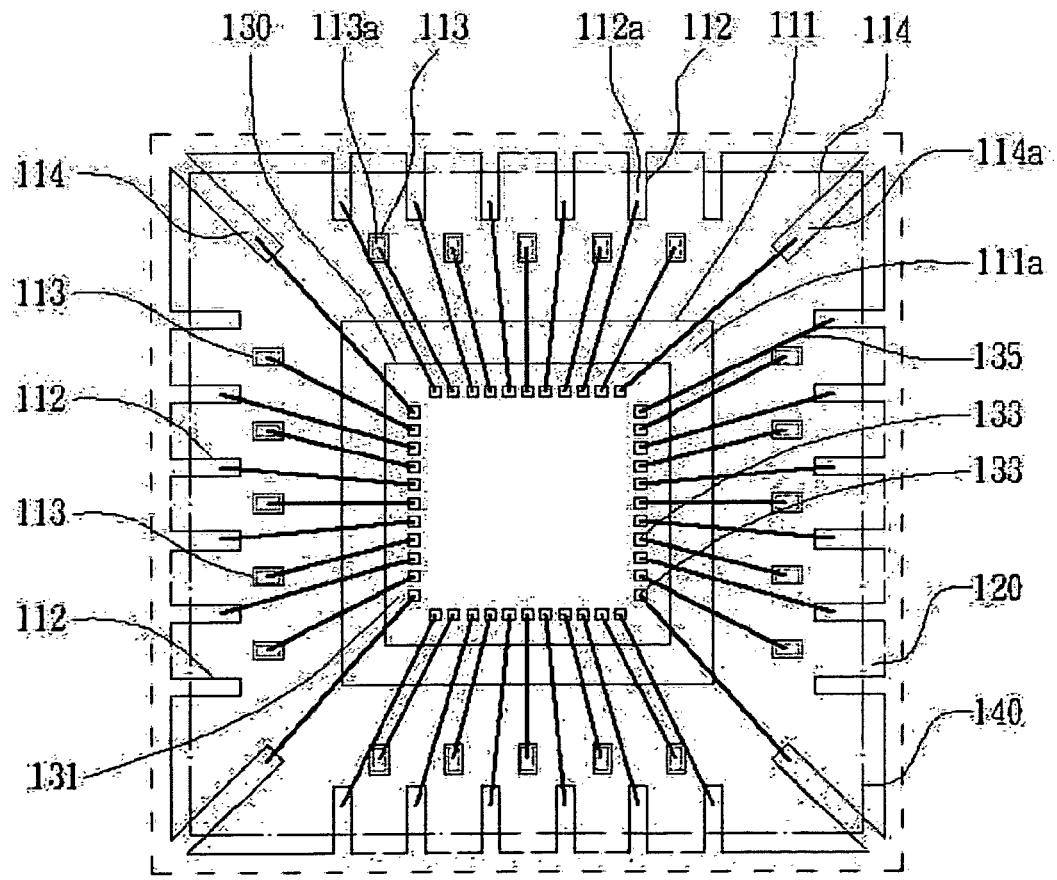
FIG. 4 is a top view of the leadless semiconductor package before encapsulation according to the first embodiment of the invention.
Figure 5:
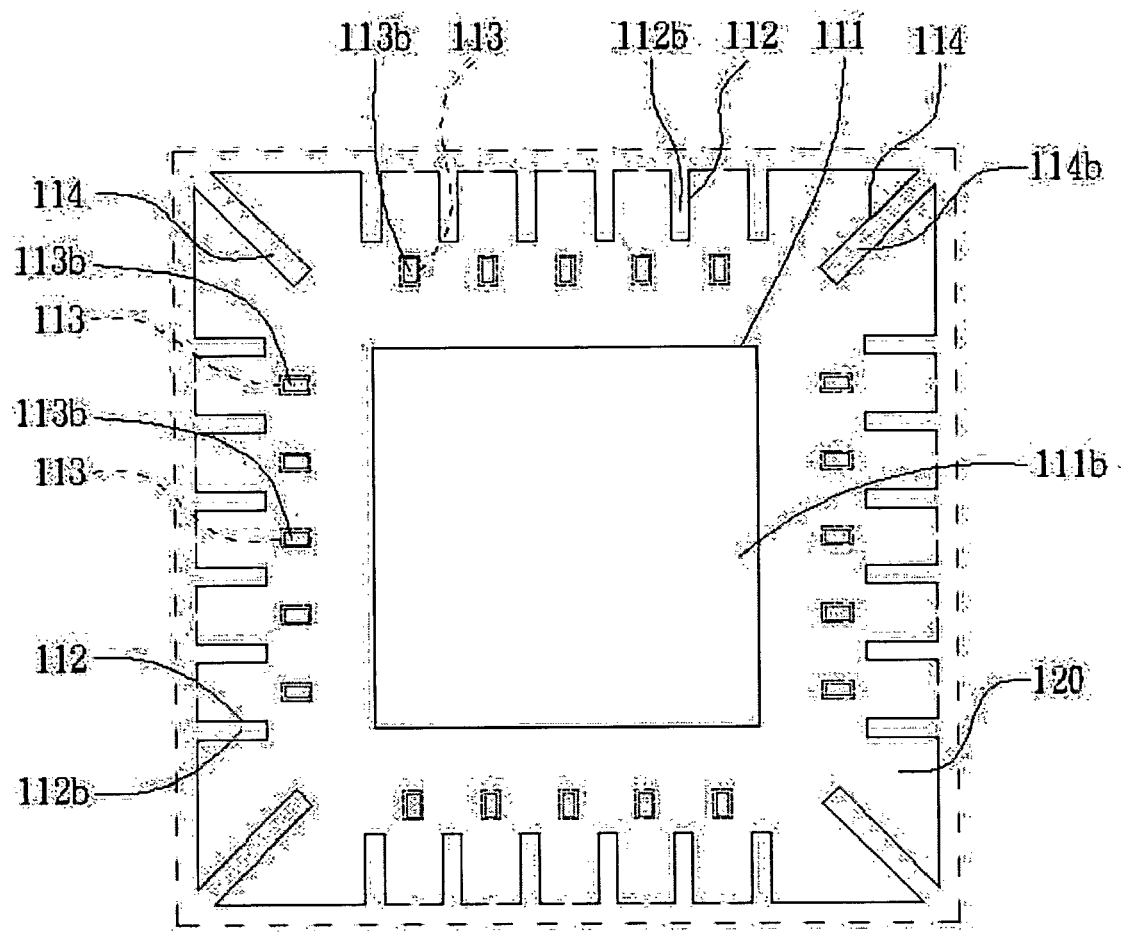
FIG. 5 is a bottom view of the leadless semiconductor package according to the first embodiment of the invention.

Referring to FIGS. 3, 4 and 5, a leadless semiconductor package 100 mainly includes at least a chip pad 111, a plurality of inner leads 112, 113, and 114, a non-conductive ink 120, a semiconductor chip 130 and a molding compound 140. The chip pad 111 and the inner leads 112, 113, and 114 are components of a leadframe. Referring to FIG. 4, the inner leads 112, 113, and 114 are classified as a plurality of first inner leads 112, a plurality of second inner leads 113 and at least a third inner lead 114. The chip pad 111 is formed at the central region of the leadframe. The non-conductive ink 120 is formed among the first inner leads 112, the second inner leads 113 and the third inner lead 114. Preferably, the non-conductive ink 120 is formed between the chip pad 111 and the inner leads 112, 113, and 114 and between every two of the leads 112, 113, and 114, and couples the first inner leads 112, the second inner leads 113, the third inner lead 114, and the chip pad 111. Therefore, the chip pad 111 can be coupled to the leadframe without using conventional tie bars, and the chip pad 111 can couple and fix the inner leads 112, 113, and 114 without using tie bars. The first inner leads 112 are farther away from the chip pad 111, while the second inner leads 113 are closer to the chip pad 111. The first inner leads 112 and the second inner leads 113 are arranged in multi-rows on outer periphery of the chip pad 111. Besides, the third inner lead 114 is disposed at a corner of the molding compound 140. Referring to FIG. 3, the non-conductive ink 120 is formed on between the top surfaces 112a and the bottom surfaces 112b of the first inner leads 112. The thickness of the non-conductive ink 120 is preferably smaller than the thickness of the first inner leads 112. The manufacturing method of the leadless leadframe having the non-conductive ink 120 is disclosed below.

Moreover, the semiconductor chip 130 is disposed on the chip pad 111 and has an active surface 131 and a corresponding rear surface 132. A plurality of bonding pads 133 are disposed on the active surface 131. An adhesive 134 is attached onto the rear surface 132 of the chip 130 and the top surface 111a of the chip pad 111. The bonding pads 133 of the chip 130, via a plurality of bonding wires 135, are coupled to the corresponding top surfaces 112a of the first inner leads 112, the corresponding top surfaces 113a of the second inner leads 113 and the corresponding top surfaces 114a of the third inner lead 114 for electrically connecting the chip 130 to the inner leads 112, 113, and 114.

The molding compound 140 is formed on the first inner leads 112, the second inner leads 113, the third inner lead 114 and the non-conductive ink 120 for encapsulating the semiconductor chip 130. In the present embodiment, the bottom surfaces 112b of the first inner leads 112, the bottom surfaces 113b of the second inner leads 113, the bottom surface 114b of the third inner lead 114 and the bottom surface 111b of the chip pad 111 expose the non-conductive ink 120. Normally, the molding compound 140 is formed via molding. The clearances among the first inner leads 112, the second inner leads 113, the third inner lead 114 and the chip pad 111 are filled up by the non-conductive ink 120. Therefore, during molding process, the molding compound 140 would not contaminate the bottom surfaces 112b of the first inner leads 112, the bottom surfaces 113b of the second inner leads 113, the bottom surface 114b of the third inner lead 114 and the bottom surface 111b of the chip pad 111. Hence, external electrical conduction and heat dissipation are provided, and an external tape which would otherwise be used in conventional leadless packaging process is no longer required. Furthermore, the second inner leads 113 positioned in inner rows can be mechanically fixed by the non-conductive ink 120 instead of being connected to the frame bars of the leadframe during the process of packaging and hence can be arranged in a higher density. That is to say, after packaging, the second inner leads 113 do not need to be extended to lateral side of molding compound 140, and can be disposed in an optional location.

In the above leadless semiconductor package 100, the chip pad 111, the first inner leads 112, the second inner leads 113, the third inner lead 114 are mechanically connected and fixed by the non-conductive ink 120 instead of being connected via the tie bars disposed at the corners of the molding compound according to a conventional practice. Therefore, the number and position of the chip pad 111 can be in an optional location, and more of the third inner leads 114 can be disposed at the corners of the molding compound 140. Besides, the first inner leads 112 and the second inner leads 113 arranged in multi-rows are also connected and fixed by the non-conductive ink 120. Therefore, during the manufacturing process, the second inner leads 113 arranged in inner rows can either use extremely narrow leads to pass through the first inner leads 112 to be connected to the leadless leadframe, or be etched or half-etched, without being connected to the leadless leadframe.

Figure 6A:
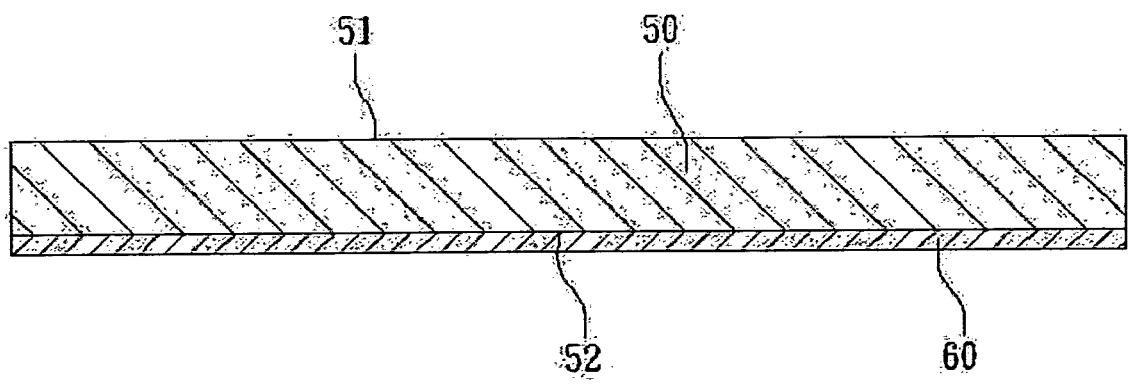
FIGS. 6A to 6I are cross-sectional views of a leadless leadframe applicable to the leadless semiconductor package during manufacturing process according to the first embodiment of the invention.
Figure 6B:
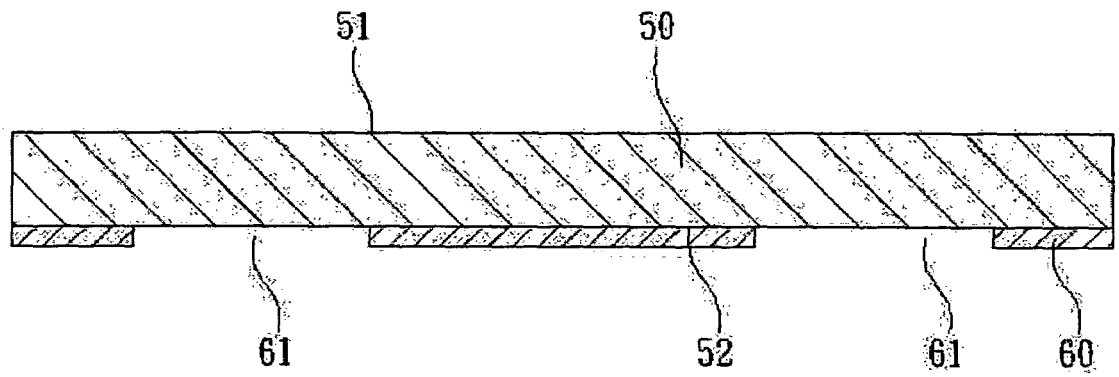
Figure 6C:
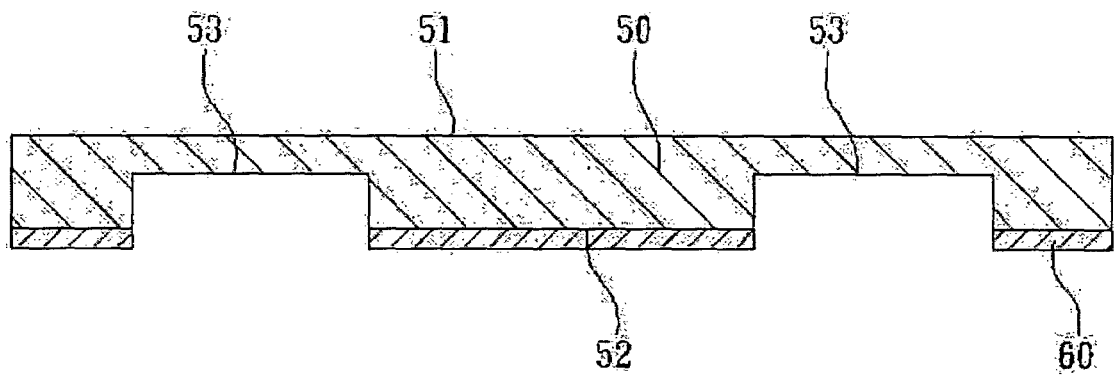
Figure 6D:
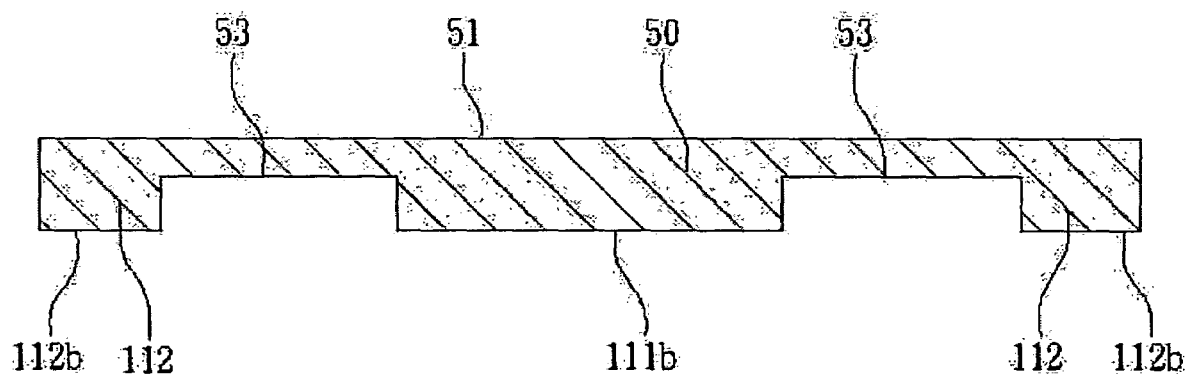
Figure 6E:
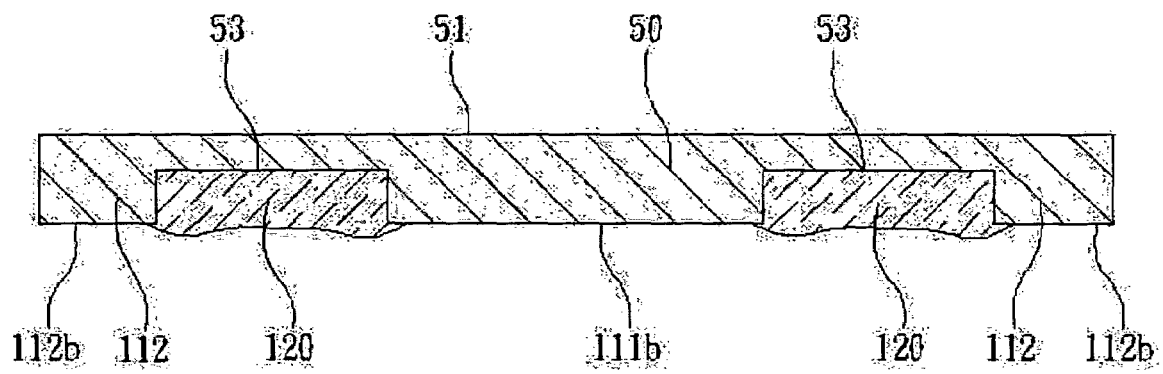
Figure 6F:
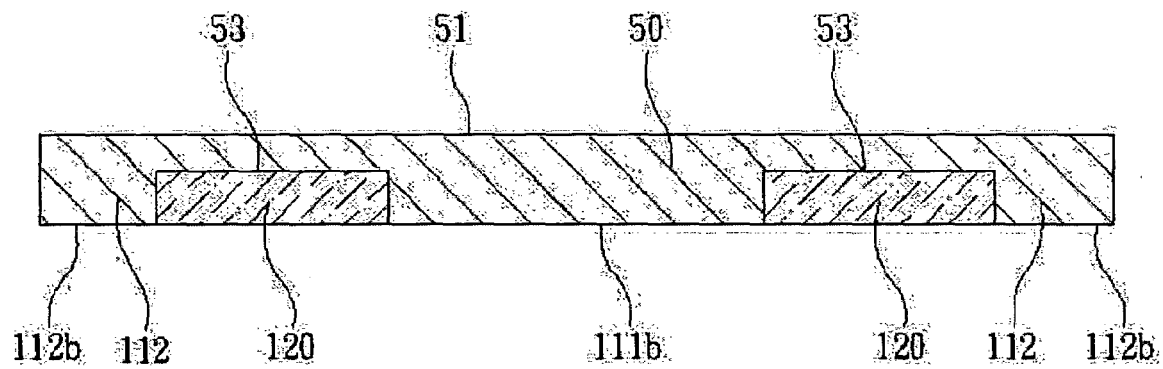
Figure 6G:
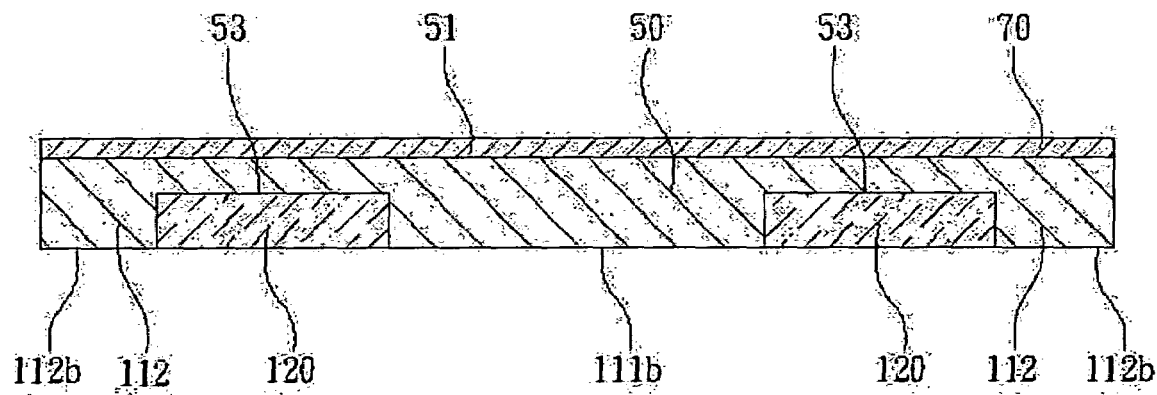
Figure 6H:
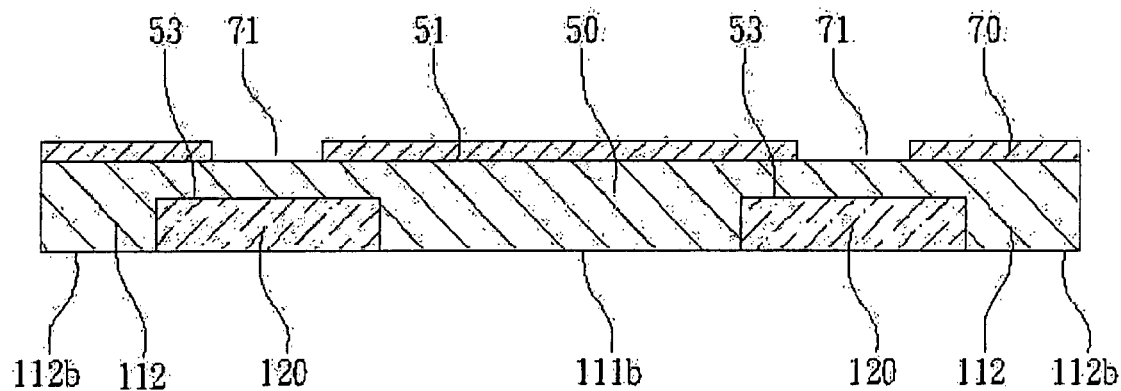
Figure 6I:
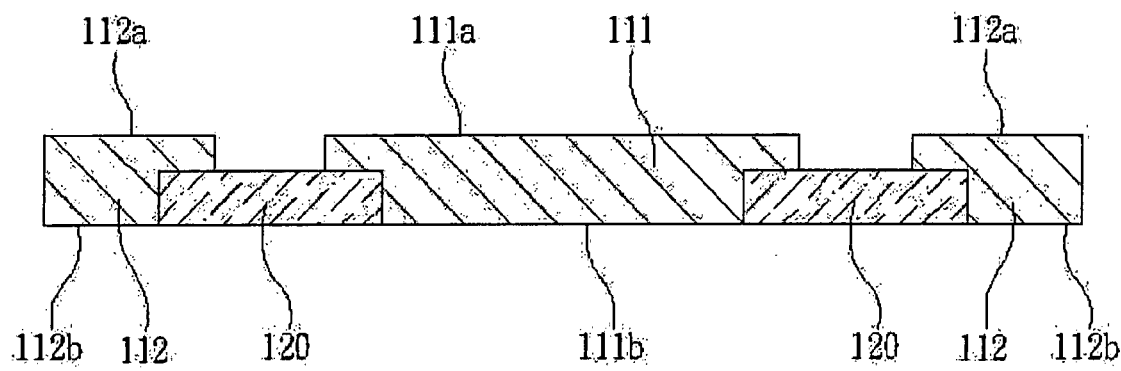

The manufacturing process of the leadless leadframe according to the above leadless semiconductor package 100 is disclosed. Referring to FIG. 6A, a metal plate 50 with a top surface 51 and a bottom surface 52 is shown. At least region for forming the chip pad 111 and a region for forming the inner leads 112, 113, and 114 are defined on the metal plate 50. A first dry film 60 is attached onto the bottom surface 52 of the metal plate 50. Next, referring to FIG. 6B, the first dry film 60 is exposed and developed to pattern the first dry film 60. A plurality of openings 61 formed on the first dry film 60 expose the region on the bottom surface 52 of the metal plate 50 excluding the part on the region for forming the chip pad 111 and the part on the region for forming the inner leads 112, 113, and 114 for the bottom surface 52 to be half-etched. Referring to FIG. 6C, the bottom surface 52 of the metal plate 50 is half-etched via the openings 61 of the first dry film 60, so that a plurality of hollowed regions 53 are formed on the bottom surface 52. Preferably, the hollowed regions 53 do not reach the top surface 51 of the metal plate 50. Referring to FIG. 6D, after the first dry film 60 is removed, the bottom surfaces 112b of the first inner leads 112 and the bottom surface 111b of the chip pad 111 can be exposed. Also, the bottom surfaces 113b of the second inner leads 113, and the bottom surface 114b of the third inner lead 114 are exposed at the same time (not shown in the diagram). Referring to FIG. 6E, the above non-conductive ink 120 is formed on the hollowed regions 53 of the metal plate 50 via screen printing or other filling methods available. Meanwhile, the non-conductive ink 120 would not be spread to the top surface 51 of the metal plate 50. The non-conductive ink 120, having the characteristics of thermo-setting or photo-setting, is appropriately solidified or semi-solidified after filling up the hollowed regions 53. Referring to FIG. 6F, the metal plate 50 and the non-conductive ink 120 are grounded, so that the non-conductive ink 120 does not cover up the bottom surfaces 112b of the first inner leads 112 and the bottom surface 111b of the chip pad 111. Preferably, the non-conductive ink 120, the bottom surfaces 112b of the first inner leads 112 and the bottom surface 111b of the chip pad 111 are co-planar, that is, the bottom surface 52 (shown in FIG. 6A) of the metal plate 50. Referring to FIG. 6G, a second dry film 70 is attached onto the top surface 51 of the metal plate 50. Referring to FIG. 6H, the second dry film 70 is exposed and developed to pattern the second dry film 70, so that a plurality of openings 71 are formed on the second dry film 70. The openings 71 expose the region on the top surface 51 of the metal plate 50 excluding the part on the region for forming the chip pad 111 and the part on the region for forming the inner leads 112, 113, and 114. The top surface 51 of the metal plate 50 in FIG. 6H is patterned and etched to form the chip pad 111 and the first inner leads 112 in FIG. 6I. Referring to FIG. 6I, the chip pad 111 and the first inner leads 112 are connected and fixed by the non-conductive ink 120. In the present step, the second inner leads 113 and the third inner lead 114 are formed at the same time and are connected and fixed by the non-conductive ink 120 (not shown in the diagram), so the chip pad 111 does not need to be connected via the tie bars. Furthermore, the second inner leads 113 arranged in inner rows do not need the connecting lead portion of conventional width, so that the first inner lead 112 and the second inner lead 113 form a multi-row arrangement in a higher density.

Second Embodiment

Figure 7:
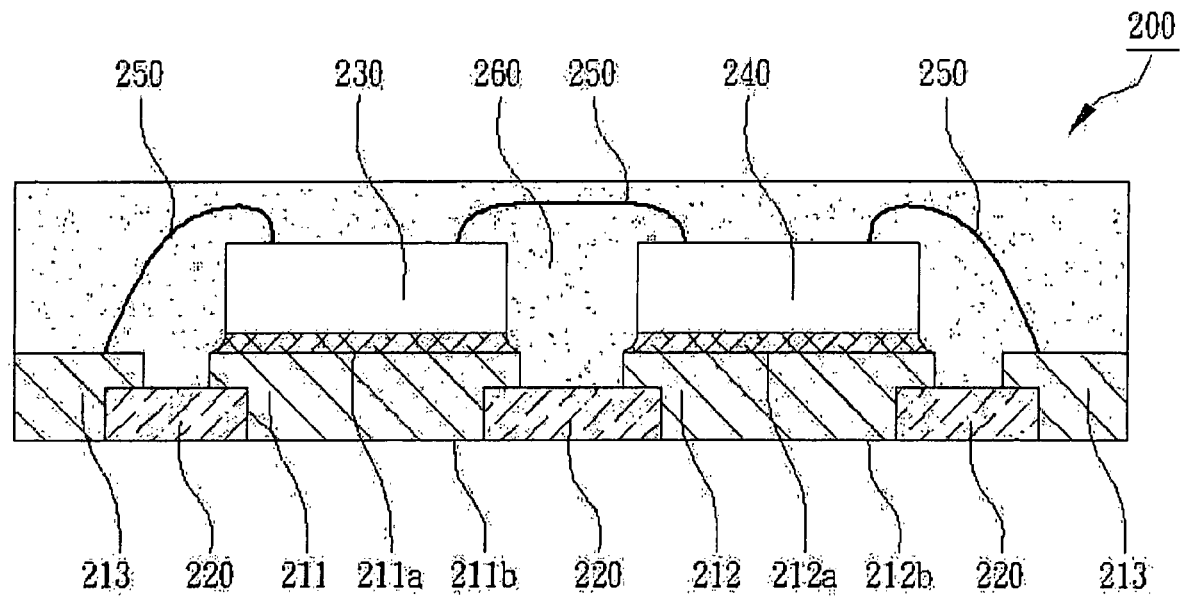
FIG. 7 is a cross-sectional view of a leadless semiconductor package according to a second embodiment of the invention.
Figure 8:
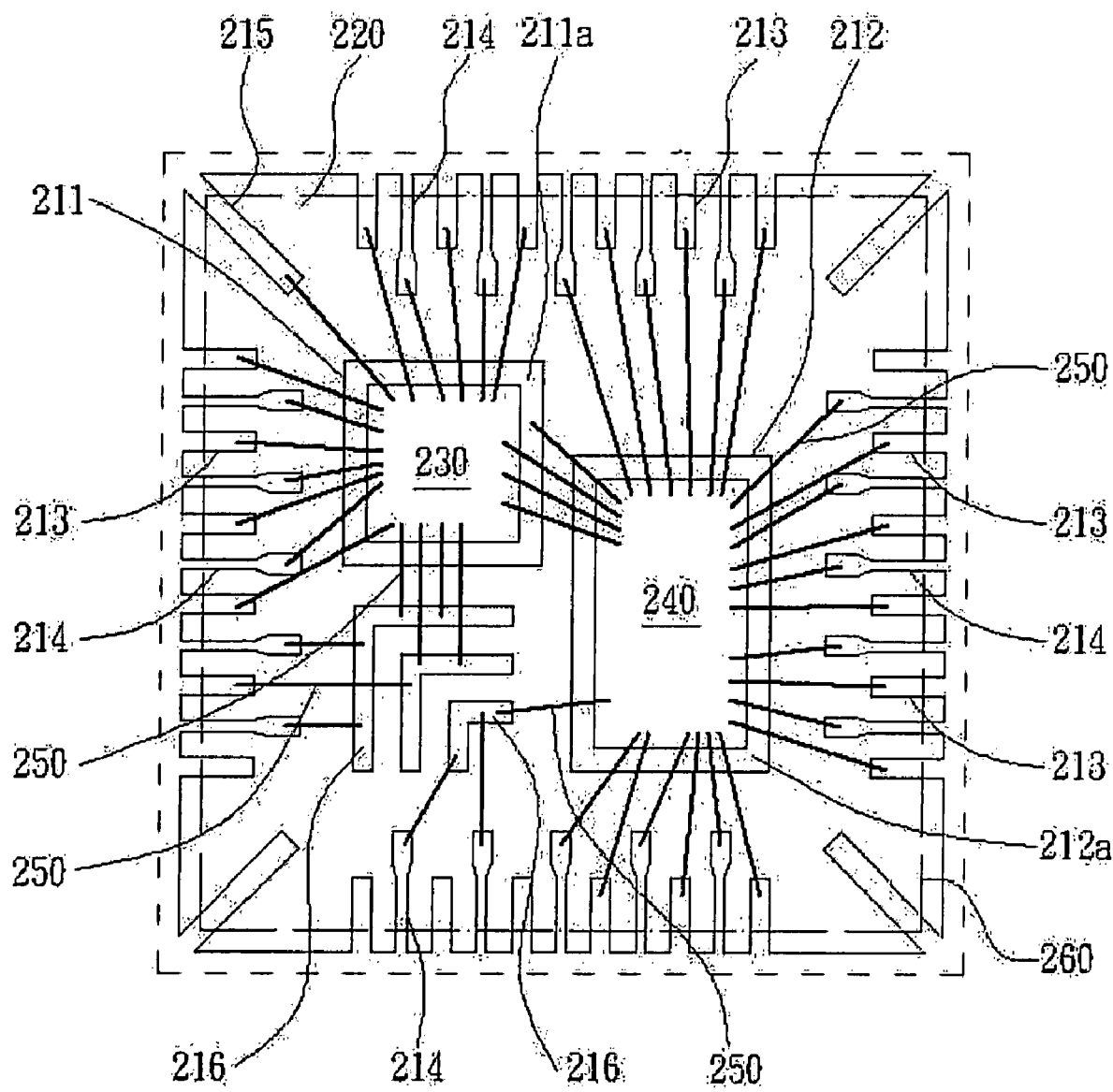
FIG. 8 is a top view of the leadless semiconductor package before encapsulation according to the second embodiment of the invention.

Refer to FIGS. 7 and 8. Since the inner leads of the invention can be intensively arranged to provide more external connecting ends. A leadless semiconductor package 200 is multi-chip package including a first chip pad 211, a second chip pad 212, a plurality of first inner leads 213, a plurality of second inner leads 214, a plurality of third inner lead 215 and at least an interconnecting lead 216. The first chip pad 211, the second chip pad 212, the first inner leads 213, the second inner leads 214, the third inner lead 215 and at least a interconnecting lead 216 are components of a leadframe. The first inner leads 213 are arranged in outer rows positioned farther away from the first chip pad 211 and the second chip pad 212. The second inner leads 214 are arranged in inner rows positioned closer to the first chip pad 211 and the second chip pad 212 as shown in FIG. 8. The third inner leads 216 are arranged at the corners of package unit of the leadframe. A non-conductive ink 220 is formed among the first chip pad 211, the second chip pad 212, the first inner leads 213, the second inner leads 214, the third inner leads 215 and the interconnecting lead 216. The first chip pad 211, the second chip pad 212, the first inner leads 213, the second inner leads 214, the third inner leads 215 and the interconnecting lead 216 are coupled and fixed by the non-conductive ink 220. Therefore, the first chip pad 211, the second chip pad 212 and the interconnecting lead 216 can be fixed without being connected to any metal tie bar, increasing the flexibility in the design of the chip pads 211 and 212 and the leads 213, 214, 215, and 216. A first semiconductor chip 230 is disposed on the top surface 211a of the first chip pad 211. A second semiconductor chip 240 is disposed on the top surface 212a of the second chip pad 212. Via a plurality of bonding wires 250, the first semiconductor chip 230 and the second semiconductor chip 240 are electrically connected to the corresponding first inner lead 213 or second inner lead 214. When electrical conductivity can not be achieved directly, the interconnecting lead 216 is used to connect at least a bonding wire 250 to the first semiconductor chip 230 or connect the second semiconductor chip 240 to the interconnecting lead 216, then another bonding wire 250 is used to connect the interconnecting lead 215 to the corresponding first inner lead 213 or second inner lead 214. A molding compound 260 is formed on the first inner leads 213, the second inner lead 214, the third inner leads 215, the interconnecting lead 216 and the non-conductive ink 220 for encapsulating the first semiconductor chip 230 and the second semiconductor chip 240. Besides, the third inner leads 215 can be formed at the corners of the molding compound 260 to increase the arrangement density of the inner leads.

Third Embodiment

Figure 9:
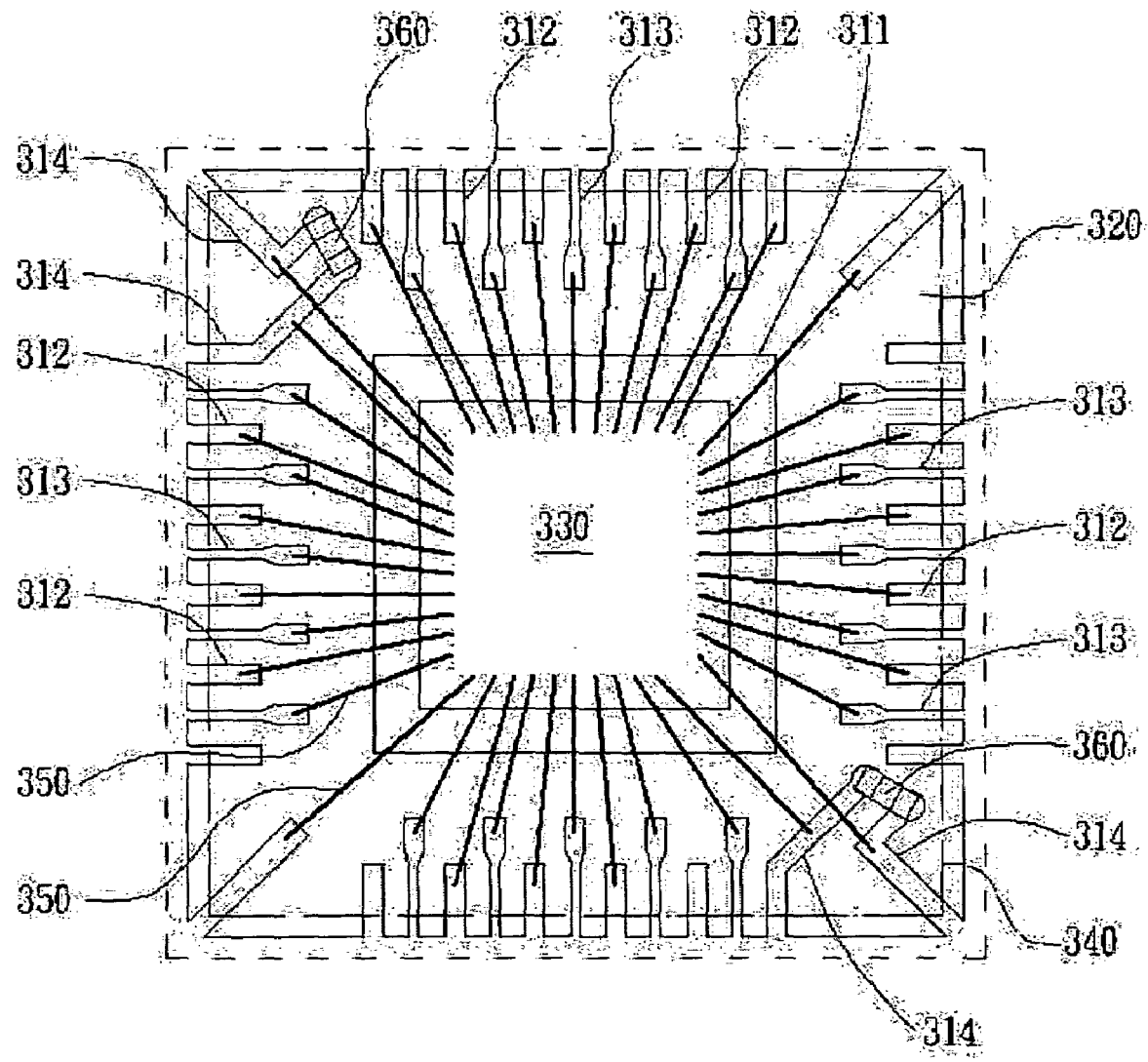
FIG. 9 is a top view of a leadless semiconductor package before encapsulation according to a third embodiment of the invention.

Referring to FIG. 9, a leadless semiconductor package mainly includes a chip pad 311, a plurality of first inner leads 312, a plurality of second inner leads 313, a plurality of third inner lead 314, a non-conductive ink 320, a semiconductor chip 330 and a molding compound 340. The chip pad 311, the first inner leads 312, the second inner leads 313, the third inner lead 314, the non-conductive ink 320, the semiconductor chip 330 and the molding compound 340 are components of a leadless leadframe. The second inner leads 313, which correspond to the location of the first inner leads 312, are closer to the chip pad 311 and are positioned in inner rows. The third inner leads 314 are formed at the corners of the molding compound 340. The non-conductive ink 320 is formed among the first inner leads 312, the second inner leads 313 and the third inner leads 314, and couples the inner leads 312, 313, 314 and the chip pad 311. The semiconductor chip 330 is disposed on the chip pad 311. Besides, the chip pad 311 can be replaced by the non-conductive ink 320. That is, the semiconductor chip 330 is disposed on the non-conductive ink 320. The non-conductive ink 320, which can replace the conventional tie bar or the chip pad 311, is electrically connected to the first inner leads 312 and the corresponding second inner leads 313 via a plurality of bonding wires 350. The molding compound 340 is formed on the inner leads 312, 313, and 314 and the non-conductive ink 320 for encapsulating the semiconductor chip 330. In addition, a capacitor, a resistor or an inductive passive component 360 is disposed on the third inner leads 314, and at least a bonding wire 350 is electrically connects the semiconductor chip 330 to one of the third inner leads 314 to enhance the electrical functions of the leadless semiconductor package.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a leadless semiconductor package, comprising:
   (a) providing a metal plate having an upper surface and a lower surface;
   (b) half-etching the lower surface of the metal plate, so as to form a recession;
   (c) forming a non-conductive ink in the recession of the metal plate;
   (m) grinding the lower surface of the metal plate where the recession is formed and the non-conductive ink, so that the non-conductive ink does not cover the lower surface of the metal plate;
   (d) patterning the upper surface of the metal plate corresponding to the location of the non-conductive ink to form a plurality of inner leads and a chip pad connected to the inner leads by the non-conductive ink so that the non-conductive ink is between every two of the inner leads and couples the inner leads to the chip pad;
   (e) placing a semiconductor chip on the chip pad;
   (f) using a plurality of bonding wires electrically connecting the semiconductor chip to the inner leads; and (g) forming a molding compound on the inner leads and the non-conductive ink for encapsulating the semiconductor chip and the bonding wires;

wherein the step (d) is performed after the step (c).

2. The method according to claim 1, wherein the inner leads are in multi-row arrangements.

3. The method according to claim 1, further comprising:

(l) placing a passive component on part of the inner leads.

4. A method for manufacturing a leadless semiconductor package, comprising:

(a) providing a metal plate having an upper surface and a lower surface;

(b) half-etching the lower surface of the metal plate, so as to form a recession;

(c) forming a non-conductive ink in the recession of the metal plate;

(m) grinding the lower surface of the metal plate where the recession is formed and the non-conductive ink, so that the non-conductive ink does not cover the lower surface of the metal plate;

(h) patterning the upper surface of the metal plate corresponding to the location of the non-conductive ink to form a plurality of inner leads connected by the non-conductive ink so that the non-conductive ink is between every two of the inner leads;

(i) placing a semiconductor chip on the non-conductive ink;

(j) using a plurality of bonding wires electrically connecting the semiconductor chip to the inner leads; and (k) forming a molding compound on the inner leads and the non-conductive ink for encapsulating the semiconductor chip and the bonding wires; wherein the step (h) is performed after the step (c).

5. The method according to claim 4, wherein the inner leads are in multi-row arrangements.

6. The method according to claim 4, further comprising:

(l) placing a passive component on part of the inner leads.

7. A method for manufacturing a leadframe for a leadless semiconductor package, comprising:

(a) providing a metal plate having an upper surface and a lower surface;

(b) half-etching the lower surface of the metal plate, so as to form a recession;

(c) forming a non-conductive ink in the recession of the metal plate;

(m) grinding the lower surface of the metal plate where the recession is formed and the non-conductive ink, so that the non-conductive ink does not cover the lower surface of the metal plate; and (d) patterning the upper surface of the metal plate corresponding to the location of the non-conductive ink to form a plurality of inner leads and a chip pad connected to the inner leads by the non-conductive ink so that the non-conductive ink is between every two of the inner leads and couples the inner leads to the chip pad;

wherein the step (d) is performed after the step (c).

8. The method according to claim 3, wherein in the step (l), one end of the passive component is located on one of the inner leads and the another end of the passive component is located on another one of the inner leads.

9. The method according to claim 6, wherein in the step (l), one end of the passive component is located on one of the inner leads and the another end of the passive component is located on another one of the inner leads.

10. The method according to claim 1, wherein in the step (d), the part of the upper surface which is patterned is smaller than the recession.

11. The method according to claim 4, wherein in the step (h), the part of the upper surface which is patterned is smaller than the recession.

12. The method according to claim 7, wherein in the step (d), the part of the upper surface which is patterned is smaller than the recession.

13. The method according to claim 1, wherein the step (e) is performed after the step (m).

14. The method according to claim 4, wherein the step (i) is performed after the step (m).

15. The method according to claim 1, wherein in the step (d), a part of the upper surface of the metal plate is etched and all of the part of the upper surface which is etched is corresponding to the location of the non-conductive ink.

16. The method according to claim 4, wherein in the step (h), a part of the upper surface of the metal plate is etched and all of the part of the upper surface which is etched is corresponding to the location of the non-conductive ink.

* * * * *